US012802742B2

(12) United States Patent
Momma et al.

(10) Patent No.: US 12,802,742 B2
(45) Date of Patent: Nov. 17, 2026

(54) SEMICONDUCTOR DEVICE HAVING MODE REGISTER

(71) Applicant: MICRON TECHNOLOGY, INC., Boise, ID (US)

(72) Inventors: Atsuko Momma, Sagamihara (JP); Yutaka Uemura, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 116 days.

(21) Appl. No.: 19/011,178

(22) Filed: Jan. 6, 2025

(65) Prior Publication Data

US 2025/0252991 A1 Aug. 7, 2025

Related U.S. Application Data

(60) Provisional application No. 63/550,198, filed on Feb. 6, 2024.

(51) Int. Cl.
*G11C 11/408* (2006.01)

(52) U.S. Cl.
CPC .................................. *G11C 11/4087* (2013.01)

(58) Field of Classification Search
CPC .................................................. G11C 11/408
USPC .................................................. 365/230.06
See application file for complete search history.

(56) References Cited

U.S. PATENT DOCUMENTS 5,555,437 A * 9/1996 Packer .................. G06F 3/0601 710/5
5,655,132 A * 8/1997 Watson .................. G06F 9/462 712/E9.023
2009/0154244 A1* 6/2009 Shiga .................. G11C 29/028 365/185.11

* cited by examiner

*Primary Examiner* — Muna A Techane
(74) *Attorney, Agent, or Firm* — Dorsey & Whitney LLP

(57) ABSTRACT

An example apparatus includes a command decoder configured to supply a plurality of mode parameters including a first mode parameter, a main mode register including a plurality of unit registers each configured to store an associated one of the plurality of mode parameters, a first local mode register configured to store at least a part of the first mode parameter, and a first circuit configured to be controlled by at least the part of the first mode parameter supplied from the first local mode register. A distance between the first local mode register and the first circuit is shorter than a distance between the main mode register and the first circuit. The first mode parameter supplied from the command decoder is stored in each of the main mode register and the first local mode register responsive to a mode register write signal.

20 Claims, 13 Drawing Sheets

| MR# | OP<7> | OP<6> | OP<5> | OP<4> | OP<3> | OP<2> | OP<1> | OP<0> |
|---|---|---|---|---|---|---|---|---|
| 0 | CAS Latency (CL) | | | | | | Burst Length | |
| ⋮ | ⋮ | | | | | | | |
| 6 | tRTP | | | | Write Recovery Time | | | |
| ⋮ | ⋮ | | | | | | | |
| 59 | RFM Counter | | ARFM | | BRC Support Level | Bounded Refresh Configuration | | DRFM Enable |
| ⋮ | ⋮ | | | | | | | |
| 128 | For DQ0 | | | | | | | |
| 129 | | | | | | | | |
| 130 | | | | | | | | |
| 131 | | | | | | | | |
| 132 | | | | | | | | |
| 133 | | | | | | | | |
| 134 | | | | | | | | |
| 135 | | | | | | | | |
| 136 | For DQ1 | | | | | | | |
| 137 | | | | | | | | |
| 138 | | | | | | | | |
| 139 | | | | | | | | |
| 140 | | | | | | | | |
| 141 | | | | | | | | |
| 142 | | | | | | | | |
| 143 | | | | | | | | |
| ⋮ | ⋮ | | | | | | | |
| 255 | | | | | | | | |

FIG.3

SEMICONDUCTOR DEVICE HAVING MODE REGISTER

CROSS REFERENCE TO RELATED APPLICATION(S)

This application claims priority to U.S. Provisional Application No. 63/550,198, filed Feb. 6, 2024. The aforementioned application is incorporated herein by reference, in its entirety, for any purpose.

BACKGROUND

There is a case where a semiconductor device such as a DRAM includes mode registers storing various mode parameters. The various mode parameters stored in the mode registers are supplied to respectively associated circuits.

BRIEF DESCRIPTION OF THE DRAWINGS

FIG. 3 is a table representing a part of various mode parameters allocated to a main mode register;

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessarily mutually exclusive, as some disclosed embodiments can be combined with one or more other disclosed embodiments to form new embodiments.

Figure 1:
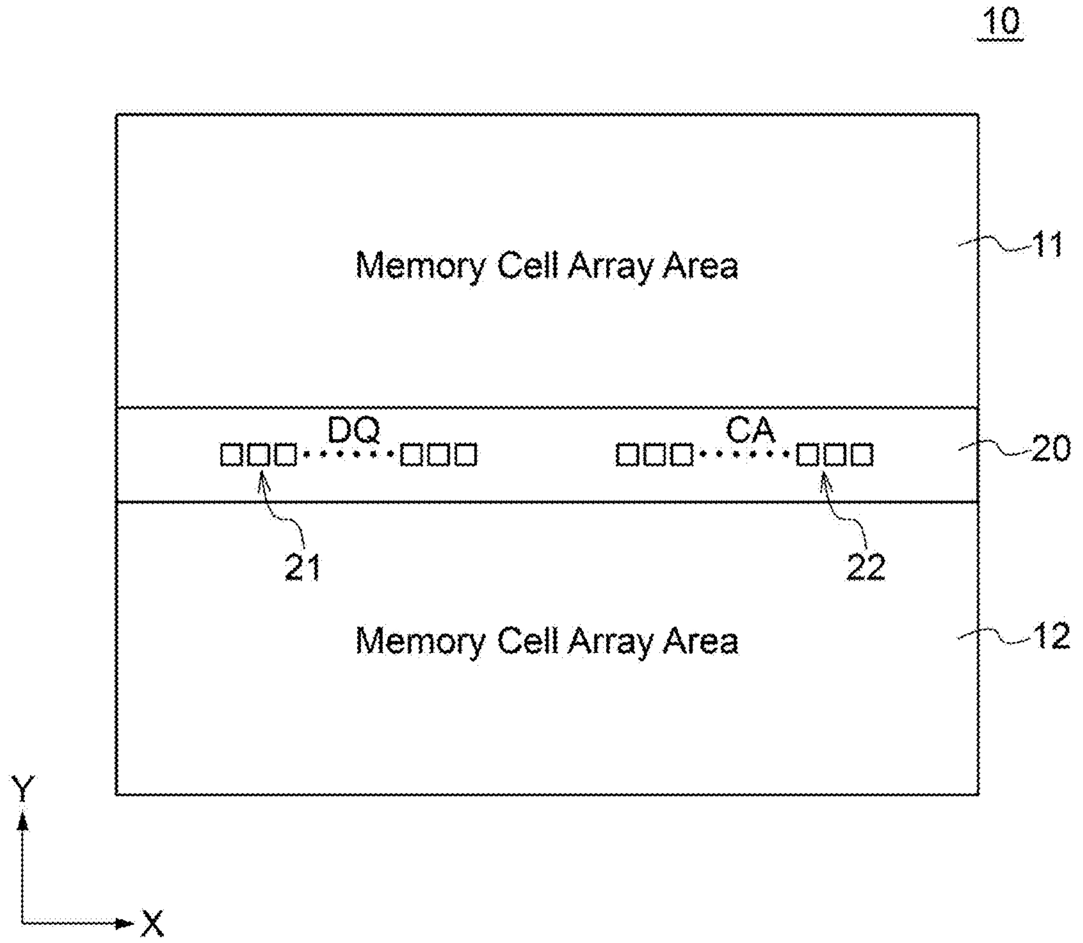
FIG. 1 is a schematic plan view for explaining a configuration of a semiconductor device according to an embodiment of the present disclosure.

FIG. 1 is a schematic plan view for explaining a configuration of a semiconductor device 10 according to an embodiment of the present disclosure. The semiconductor device 10 shown in FIG. 1 is a DDR5 DRAM and includes two memory cell array areas 11 and 12 and a center area 20. The center area 20 extends in an X direction and is sandwiched between the memory cell array areas 11 and 12 from a Y direction. A plurality of data I/O pads and a plurality of command address pads 22 are provided in the center area 20. A command address signal CA is input from outside to the command address pads 22. When a command included in the command address signal CA indicates a read operation, based on an address included in the command address signal CA, memory cells included in the memory cell array areas 11 and 12 are read-accessed. Read data DQ read out from the accessed memory cells is output to outside from the data I/O pads 21. When the command included in the command address signal CA indicates a write operation, write data DQ input from outside to the data I/O pads 21 is transferred to the memory cell array areas 11 and 12. The write data DQ transferred to the memory cell array areas 11 and 12 is written in a memory cell indicated by the address included in the command address signal CA.

Figure 2:
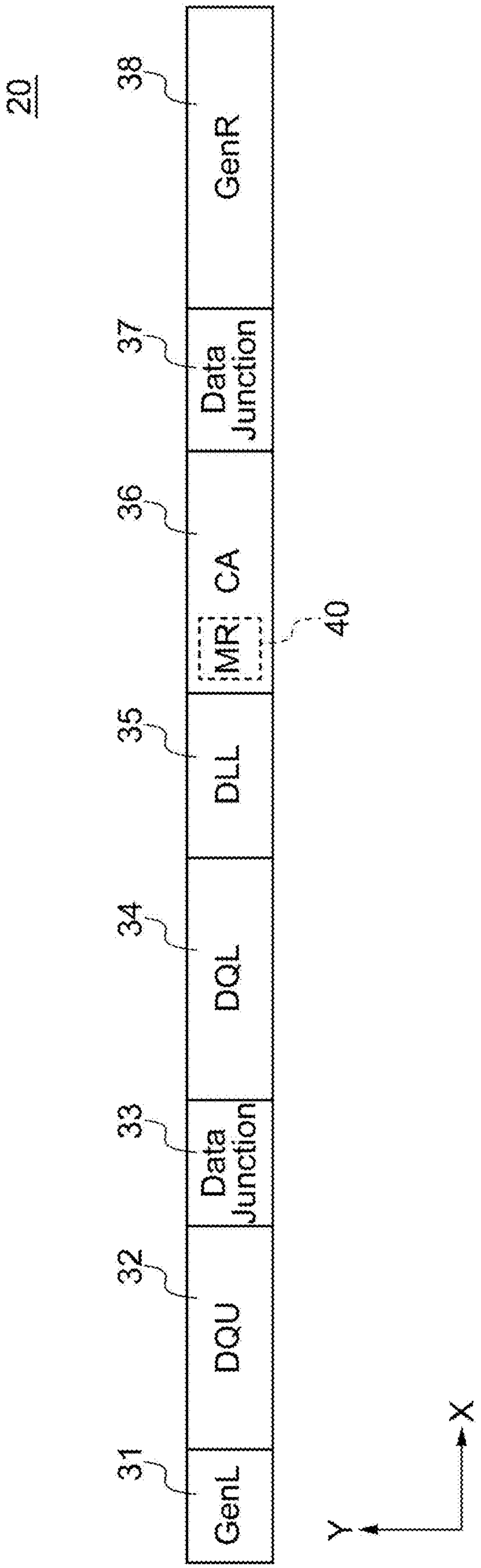
FIG. 2 is a schematic diagram for explaining a configuration of a center area.

FIG. 2 is a schematic diagram for explaining a configuration of the center area 20. In the example shown in FIG. 2, a power-supply circuit area 31 (GenL), a data input-output circuit area 32 (DQU), a data junction area 33, a data input-output circuit area 34 (DQL), a DLL circuit area 35, a command-address control circuit area 36, a data junction area 37, and a power-supply circuit area 38 (GenR) are arranged in the center area 20 in this order in the X direction. A power supply circuit that generates various internal potentials based on external power supplied from outside is respectively provided in the power-supply circuit areas 31 and 38. A data input-output circuit that controls input and output of upper bits of read data and write data is provided in the data input-output circuit area 32. A data input-output circuit that controls input and output of lower bits of read data and write data is provided in the data input-output circuit area 34. A data junction circuit including a circuit that connects a global data bus and data buses provided for each memory bank group to each other, a circuit that controls burst lengths, and a circuit that sorts burst orders and a driver used for signals sent from the center area 20 to the memory cell array areas 11 and 12 are provided in the data junction areas 33 and 37. A circuit that performs decoding of command address signals, counting of latencies, and the like is provided in the command-address control circuit area 36. A main mode register 40 that holds various mode parameters is also provided in the command-address control circuit area 36.

FIG. 3 is a table representing a part of various mode parameters allocated to the main mode register 40. In a DDR5 DRAM, 256 unit mode registers MR0 to MR255 are present. Each of the unit mode registers MR0 to MR255 is selected with an 8-bit mode address MRADD. A mode parameter MR #<7:0> respectively associated to 8-bit operands OP<0> to OP<7> is stored in each unit mode register MR #(#=0 to 255). As an example, a mode parameter MR0<7:2> associated to an operand OP<7:2> of the unit mode register MR0 indicates a CAS latency. A mode parameter MR0<1:0> associated to an operand OP<1:0> of the unit mode register MR0 indicates a burst length. A mode parameter MR6<7:4> associated to an operand OP<7:4> of the unit mode register MR6 indicates Read to Precharge Delay (tRTP). A mode parameter MR6<3:0> associated to an operand OP<3:0> of the unit mode register MR6 indicates a Write Recovery Time. Mode parameters MR59<7:6>, MR59<5:4>, MR59<3>, MR59<2:1>, and MR59<0> respectively associated to operands OP<7:6>, OP<5:4>, OP<3>, OP<2:1>, and OP<0> of the unit mode register MR59 indicate an RFM counter, an ARFM, a BRC Support Level, a Bounded Refresh Configuration, and a DRFM Enable, respectively. Each of various mode parameters MR128<7:0> to MR134<7:0> related to data DQ0 is respectively held in each of unit mode registers MR128 to MR134. Each of various mode parameters MR136<7:0> to MR143<7:0> related to data DQ1 is respectively held in each of the unit mode registers MR136 to MR143.

Most of the unit mode registers MR0 to MR255 shown in FIG. 3 are held in the main mode register 40. A part of the unit mode registers is not held in the main mode register 40 and is held in a local mode register described later. Another part of the unit mode registers is held in both the main mode register 40 and the local mode register. Still another part of the unit mode registers is held in the main mode register 40 and a plurality of local mode registers as operands OP thereof are divided into plural.

Figure 4:
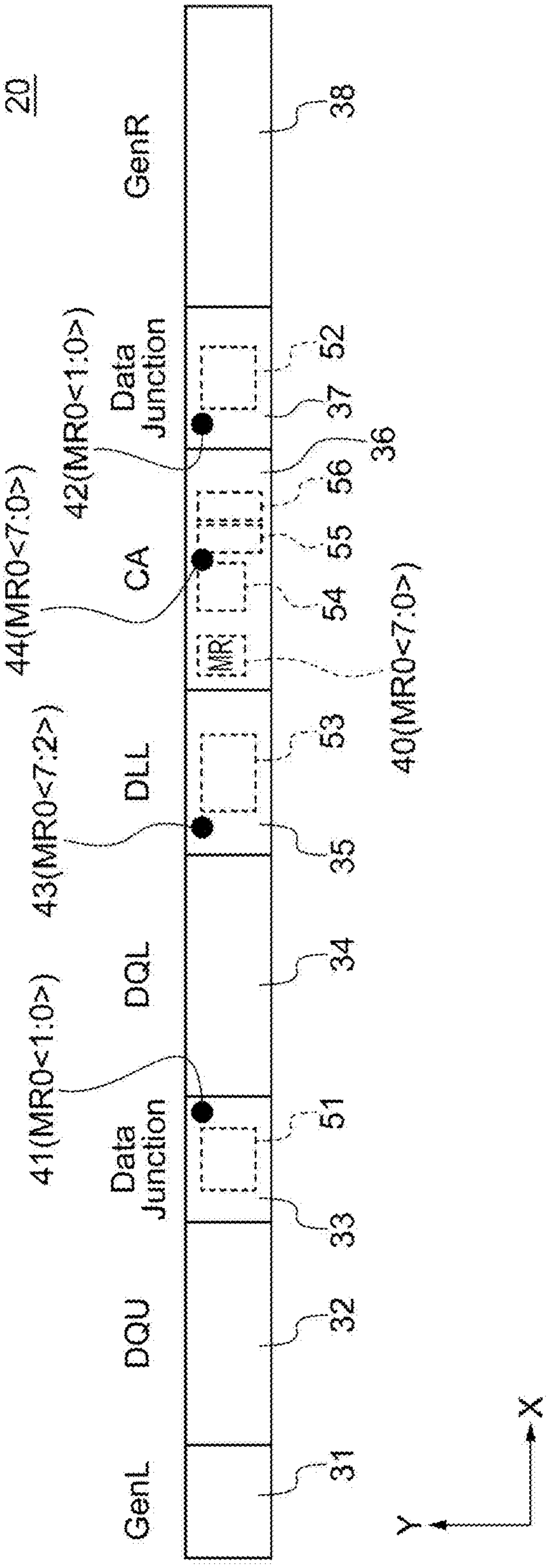
FIGS. 4, 7, 9, 11A, and 11B are schematic diagrams respectively showing a layout of the main mode register and local mode registers.

FIG. 4 is a schematic diagram showing a layout of the main mode register 40 and local mode registers 41 to 44. As shown in FIG. 4, data junction circuits 51 and 52 are provided in the data junction areas 33 and 37, respectively. A DLL circuit 53 is provided in the DLL circuit area 35. As well as the main mode register 40, a latency control circuit 54, a column control circuit 55, and a command decoder 56 are provided in the command-address control circuit area 36. While the unit register MR0 holding the mode parameter MR0<7:2> indicating a CAS latency and the mode parameter MR0<1:0> indicating a burst length is included in the main mode register 40, the mode parameters MR0<7:2> and MR0<1:0> held in the main mode register 40 are not used for counting CAS latencies and controlling burst lengths, and are held in the main mode register 40 to solely perform reading at the time of a mode register read operation.

The local mode register 41 is provided to be adjacent to the data junction circuit 51 in the data junction area 33. Therefore, the distance between the data junction circuit 51 and the local mode register 41 is shorter than the distance between the data junction circuit 51 and the main mode register 40. Similarly, the local mode register 42 is provided to be adjacent to the data junction circuit 52 in the data junction area 37. Therefore, the distance between the data junction circuit 52 and the local mode register 41 is shorter than the distance between the data junction circuit 51 and the main mode register 40. Each of the local mode registers 41 and 42 is a partial mode register that holds the mode parameter MR0<1:0>. The mode parameter MR0<1:0> held in each of the local mode registers 41 and 42 is respectively supplied to the data junction circuits 51 and 52. As shown in FIG. 3, the mode parameter MR0<1:0> indicates a burst length. Accordingly, the burst length set in the data junction circuits 51 and 52 is determined with the mode parameter MR0<1:0> respectively held in the local mode registers 41 and 42.

The local mode register 43 is provided to be adjacent to the DLL circuit 53 in the DLL circuit area 35. Therefore, the distance between the DLL circuit 53 and the local mode register 43 is shorter than the distance between the DLL circuit 53 and the main mode register 40. The local mode register 43 is a partial mode register that holds the mode parameter MR0<7:2>. The mode parameter MR0<7:2> held in the local mode register 43 is supplied to the DLL circuit 53. As shown in FIG. 3, the mode parameter MR0<7:2> indicates a CAS latency. Accordingly, the CAS latency set in the DLL circuit 53 is determined with the mode parameter MR0<7:2> held in the local mode register 43.

The local mode register 44 is provided to be adjacent to the latency control circuit 54 and the column control circuit 55 in the command-address control circuit area 36. Therefore, the distance between the local mode register 44 and the latency control circuit 54 and that between the local mode register 44 and the column control circuit 55 are shorter than the distance between the main mode register 40 and the latency control circuit 54 and that between the main mode register 40 and the column control circuit 55. The local mode register 44 holds a mode parameter MR0<7:0>. The mode parameter MR0<7:0> held in the local mode register 44 is supplied to the latency control circuit 54 and the column control circuit 55. Accordingly, the CAS latency and the burst length respectively set in the latency control circuit 54 and the column control circuit 55 are determined with the mode parameter MR0<7:0> held in the local mode register 44.

Figure 5:
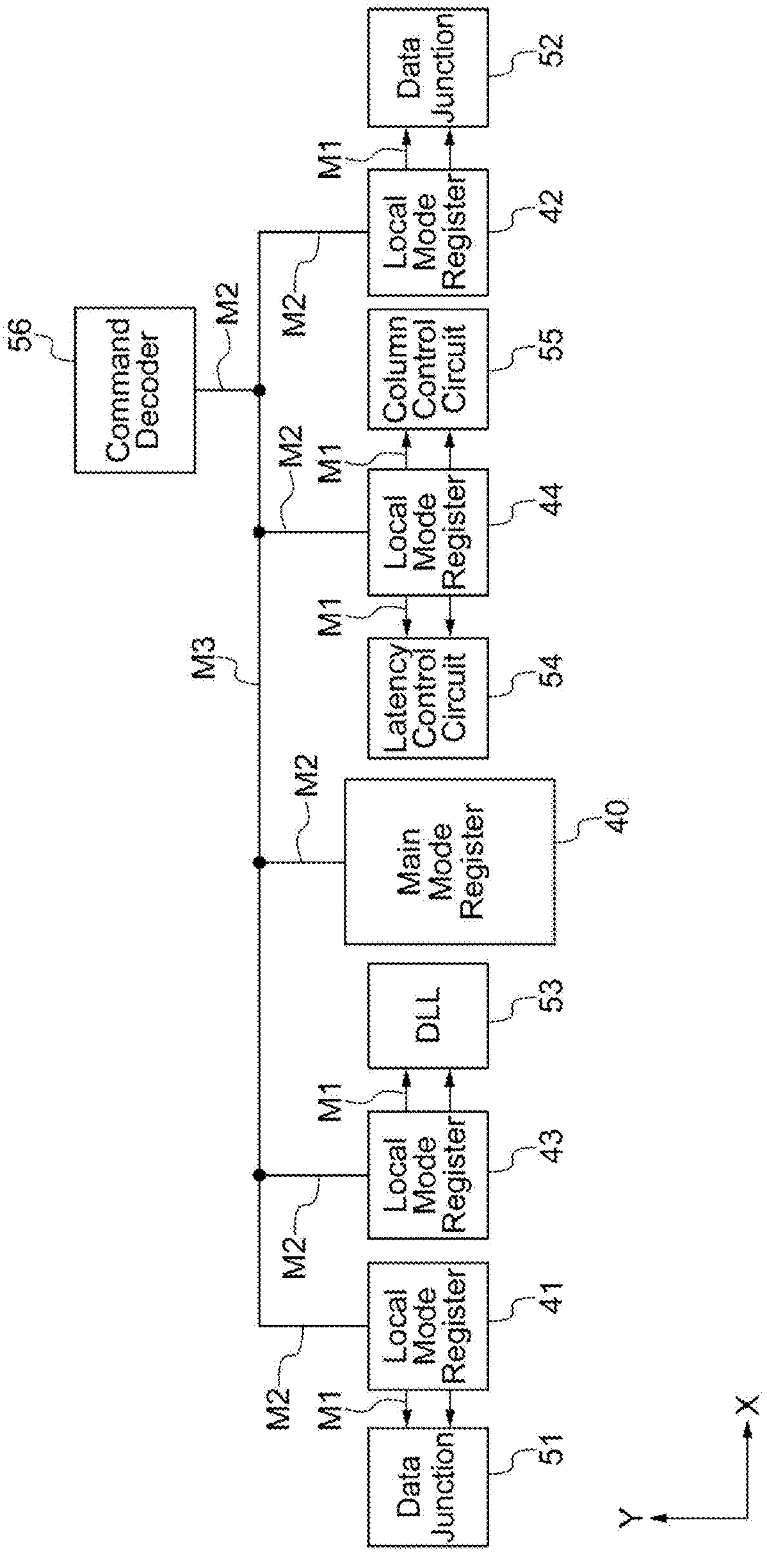
FIGS. 5, 6, 8, 10, and 12 are circuit diagrams for respectively explaining a connecting relation between a command decoder and a main mode register and that between the command decoder and local mode registers.

FIG. 5 is a circuit diagram for explaining a connecting relation between the command decoder 56 and the main mode register 40 and that between the command decoder 56 and the local mode registers 41 to 44. A large number of lines extending in the X direction and a large number of lines extending in the Y direction are provided in the center area 20. The line positioned on the lowermost layer is a line M1 and mostly extends in the X direction. A line M2 is positioned on an upper layer to the layer of the line M1 and mostly extends in the Y direction. A line M3 is positioned on an upper layer to the layer of the line M2 and mostly extends in the X direction. Another line is provided on an upper layer to the layer of the line M3. The cross-sectional area of a line is larger as it is positioned on an upper layer and thus lines on upper layers have a lower resistance value. That is, the resistance value of the line M3 is lower than that of the line M1.

The command decoder 56, the main mode register 40, and the local mode registers 41 to 44 are connected to one another via the lines M1 to M3. Since the length of the center area 20 in the X direction is longer than that in the Y direction, the majority of lines connecting the command decoder 56 and the main mode register 40 and the local mode registers 41 to 44 to one another is formed of the line M3. Accordingly, the resistance value of long-length lines connecting the command decoder 56 and the main mode register 40 and the local mode registers 41 to 44 to one another is reduced. Meanwhile, the local mode registers 41 and 42 and the data junction circuits 51 and 52, the local mode register 43 and the DLL circuit 53, and the local mode register 44 and the latency control circuit 54 and the column control circuit 55 are connected to one another mainly via the line M1. It is permissible that the line M3 is not present between the local mode registers 41 to 44 and the respective circuits mentioned above. Accordingly, the lengths of lines connecting the local mode registers 41 to 44 and the respective circuits mentioned above to one another are shortened. That is, if a part or whole of the mode parameter MR0<7:0> is supplied from the main mode register 40 to the data junction circuits 51 and 52, the DLL circuit 53, the latency control circuit 54, and the column control circuit 55, the lengths of lines required for this supply become long, so that it is necessary to mainly use the line M3. However, in the present embodiment, it is not necessary to use the line M3 in order to supply a part or whole of the mode parameter MR0<7:0> to the data junction circuits 51 and 52, the DLL circuit 53, the latency control circuit 54, and the column control circuit 55, and thus the number of lines M3 is reduced.

Figure 6:
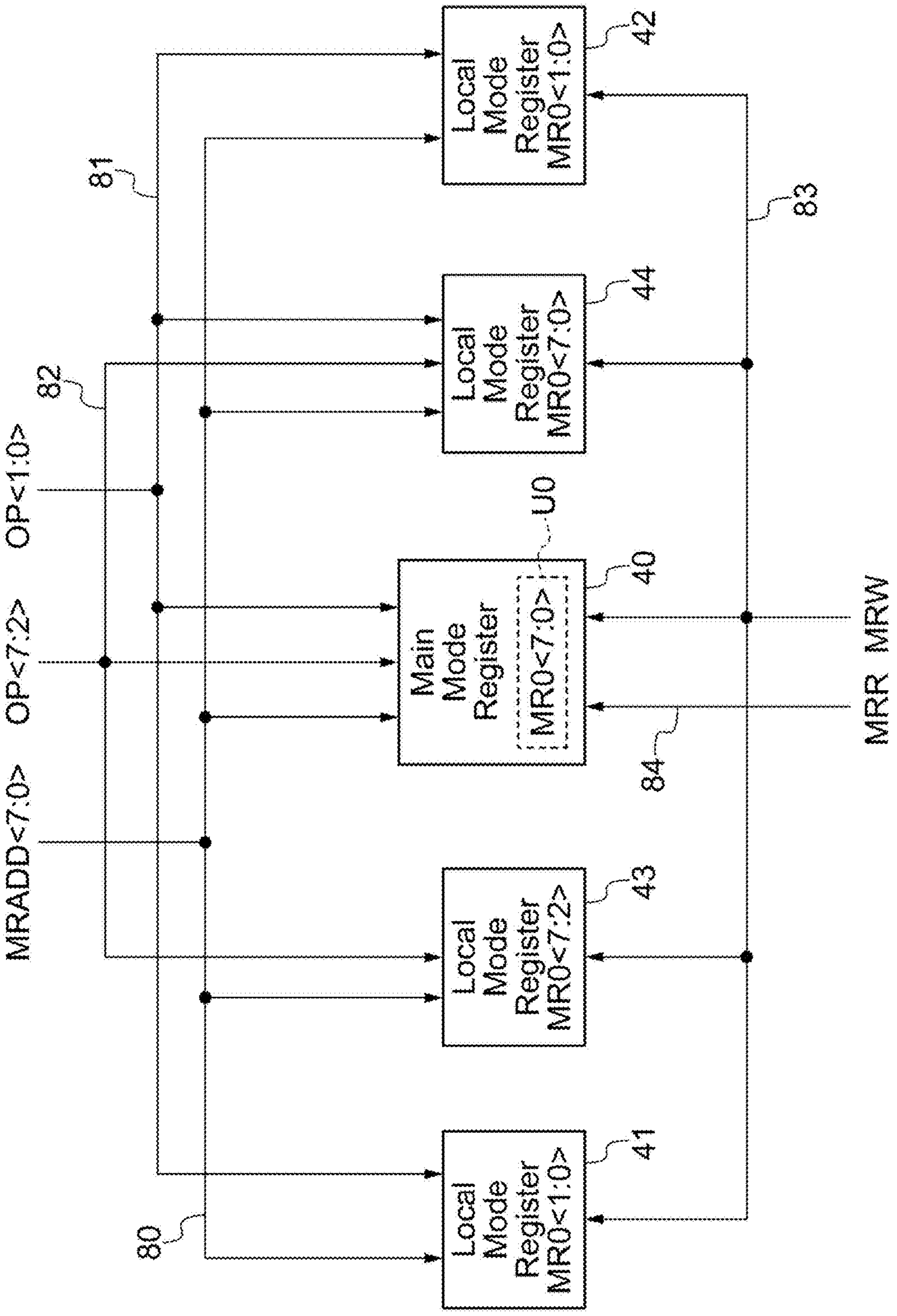

FIG. 6 is a circuit diagram for explaining lines that supply various signals output from the command decoder 56 shown in FIG. 5 to the main mode register 40 and the local mode registers 41 to 44 in more detail. As shown in FIG. 6, a signal supplied from the command decoder 56 to the main mode register 40 is an 18-bit signal of a mode address MRADD<7:0>, an operand OP<7:0>, a mode register write signal MRW, and a mode register read signal MRR that are used to select any of the unit mode registers MR0 to MR255. The mode address MRADD<7:0> is transferred via a line 80, the operand OP<1:0> is transferred via a line 81, the operand OP<7:2> is transferred via a line 82, the mode register write signal MRW is transferred via a line 83, and the mode register read signal MRR is transferred via a line 84. The lines 80 to 84 are connected to the main mode register 40 and all the signals mentioned above are supplied to the main mode register 40.

Meanwhile, while the mode address MRADD<7:0>, the operand OP<1:0>, and the mode register write signal MRW are supplied to the local mode registers 41 and 42 via the lines 80, 81, and 83, the lines 82 and 84 are not connected to the local mode registers 41 and 42, and thus the operand OP<7:2> and the mode register read signal MRR are not supplied to the local mode registers 41 and 42. Further, while the mode address MRADD<7:0>, the operand OP<7:2>, and the mode register write signal MRW are supplied to the local mode register 43 via the lines 80, 82, and 83, the lines 81 and 84 are not connected to the local mode register 43, and thus the operand OP<1:0> and the mode register read signal MRR are not supplied to the local mode register 43. While the mode address MRADD<7:0>, the operand OP<7:0>, and the mode register write signal MRW are supplied to the local mode register 44 via the lines 80 to 83, the line 84 is not connected to the local mode register 44, and thus the mode register read signal MRR is not supplied to the local mode register 44.

With this configuration, when overwriting of the mode parameter MR0<7:0> is commanded by a mode register write command from outside, the command decoder 56 activates the mode register write signal MRW and outputs the mode address MRADD<7:0> and the operand OP<7:0>. Accordingly, the mode parameter MR0<7:0> is overwritten in a unit register U0 included in the main mode register 40 and overwritten in the local mode register 44, the mode parameter MR0<1:0> is overwritten in the local mode registers 41 and 42, and the mode parameter MR0<7:2> is overwritten in the local mode register 43. In this manner, the mode parameter MR0<7:0> is held not only in the main mode register 40 but also in a plurality of local mode registers 41 to 44 that are provided dispersedly. Meanwhile, when reading of the mode parameter MR0<7:0> is commanded by a mode register read command from outside, the command decoder 56 activates the mode register read signal MRR and outputs the mode address MRADD<7:0>. Accordingly, the mode parameter MR0<7:0> is read out from the unit register U0 included in the main mode register 40. Meanwhile, the mode register read signal MRR is not supplied to the local mode registers 41 to 44, and thus the mode parameter MR0<7:0> is not read out from the local mode registers 41 to 44.

In this manner, the mode parameter MR0<7:0> is held not only in the main mode register 40 but also a part or whole thereof is held in the local mode registers 41 to 44. Since the local mode registers 41 to 44 are provided to be adjacent to respectively associated circuits 51 to 55, the lengths of lines used to supply the mode parameter MR0<7:0> to the circuits 51 to 55 are shortened.

Figure 7:
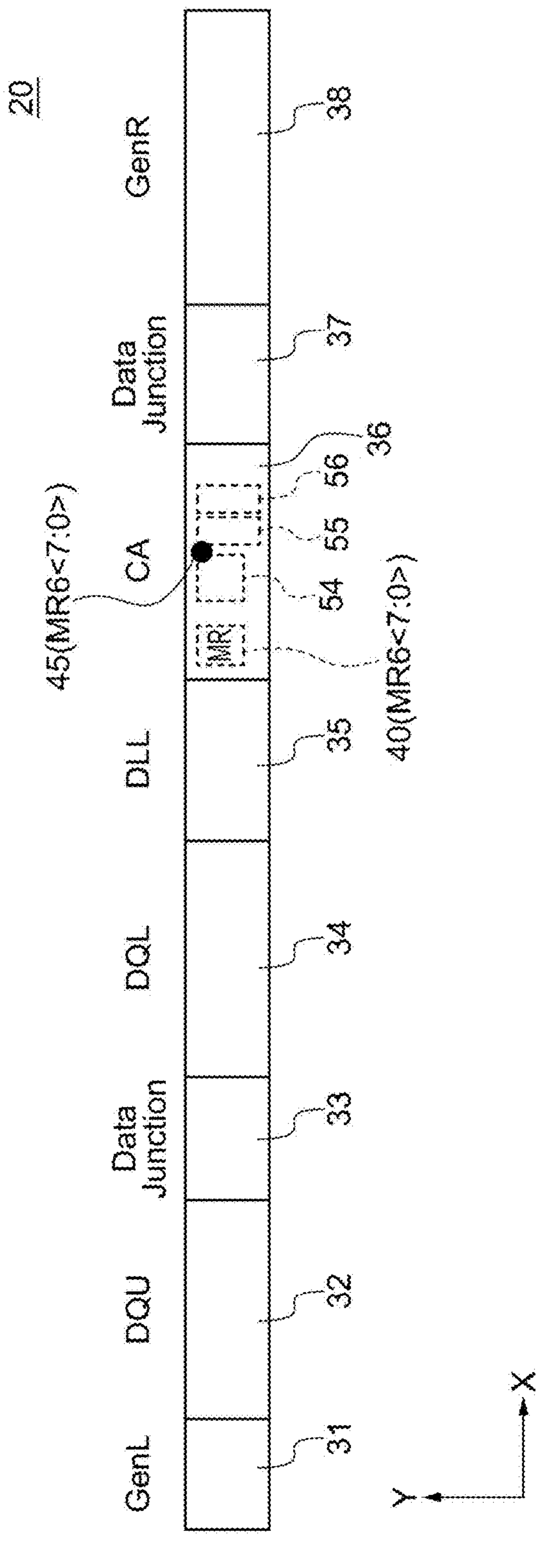

FIG. 7 is a schematic diagram showing a layout of the main mode register 40 and a local mode register 45. The local mode register 45 is provided to be adjacent to the column control circuit 55 in the command-address control circuit area 36. Therefore, the distance between the column control circuit 55 and the local mode register 45 is shorter than the distance between the column control circuit 55 and the main mode register 40. The local mode register 45 holds a mode parameter MR6<7:0>. As shown in FIG. 3, the mode parameter MR6<7:4> and the mode parameter MR6<3:0> represent a tRTP (Read to Precharge time) and a tWR (Write recovery time), respectively. The mode parameter MR6<7:0> held in the local mode register 44 is supplied to the column control circuit 55. While a unit register holding the mode parameter MR6<7:0> is included in the main mode register 40, the mode parameter MR6<7:0> held in the main mode register 40 is not used for column control on the tRTP and the tWR, and is held in the main mode register 40 to solely perform reading at the time of a mode register read operation.

Figure 8:
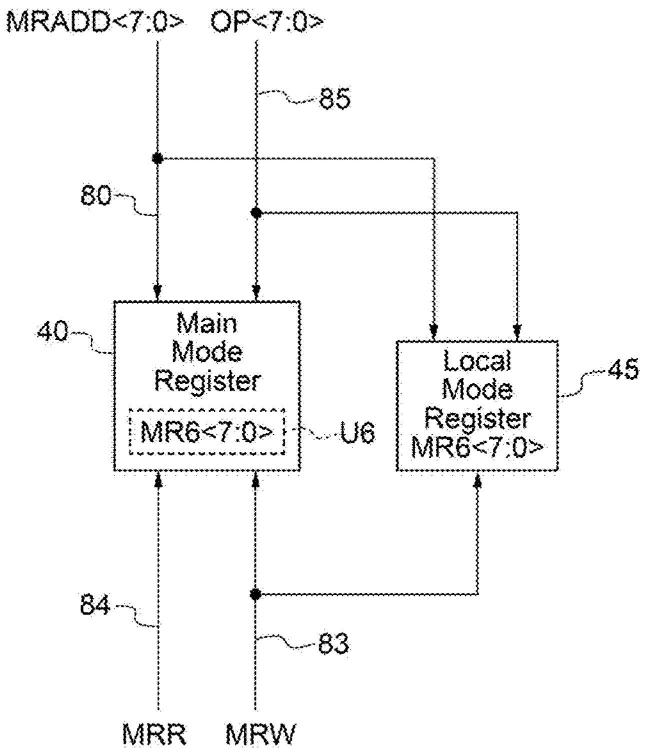

FIG. 8 is a circuit diagram for explaining lines that supply various signals output from the command decoder 56 shown in FIG. 5 to the main mode register 40 and the local mode register 45. As shown in FIG. 8, while the mode address MRADD<7:0>, the operand OP<7:0>, and the mode register write signal MRW are supplied to the local mode register 45 via the lines 80, 85, and 83, the line 84 is not connected to the local mode register 45, and thus the mode register read signal MRR is not supplied to the local mode register 45. The line 85 is a line that transfers the operand OP<7:0> and corresponds to the lines 81 and 82 shown in FIG. 6. With this configuration, when overwriting of the mode parameter MR6<7:0> is commanded by a mode register write command from outside, the command decoder 56 activates the mode register write signal MRW and outputs the mode address MRADD<7:0> and the operand OP<7:0>. Accordingly, the mode parameter MR0<7:0> is overwritten in a unit register U6 included in the main mode register 40 and overwritten in the local mode register 45. In this manner, the mode parameter MR6<7:0> is held not only in the main mode register 40 but also in the local mode register 45. Meanwhile, when reading of the mode parameter MR6<7:0> is commanded by a mode register read command from outside, the mode parameter MR6<7:0> is read out from the unit register U6 included in the main mode register 40. Meanwhile, the mode register read signal MRR is not supplied to the local mode register 45, and thus the mode parameter MR6<7:0> is not read out from the local mode register 45.

Figure 9:
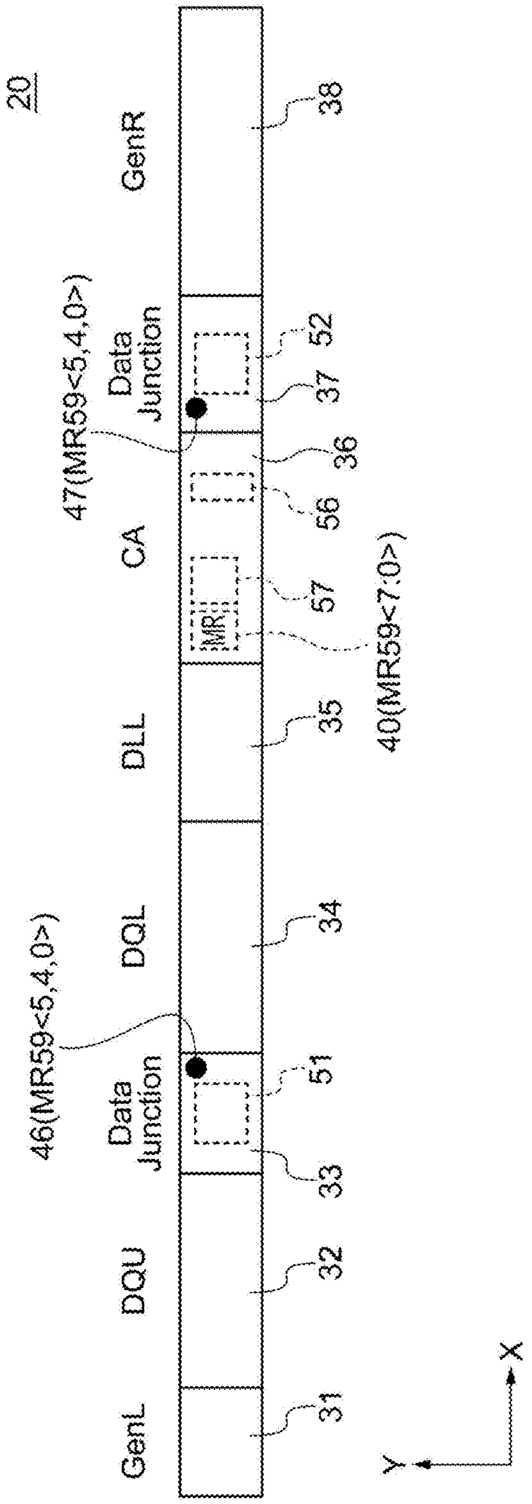

FIG. 9 is a schematic diagram showing a layout of the main mode register 40 and local mode registers 46 and 47. A refresh control circuit 57 is provided to be adjacent to the main mode register 40 in the command-address control circuit area 36. The local mode register 46 is provided to be adjacent to the data junction circuit 51 in the data junction area 33. Therefore, the distance between the data junction circuit 51 and the local mode register 46 is shorter than the distance between the data junction circuit 51 and the main mode register 40. Similarly, the local mode register 47 is provided to be adjacent to the data junction circuit 52 in the data junction area 37. Therefore, the distance between the data junction circuit 52 and the local mode register 47 is shorter than the distance between the data junction circuit 52 and the main mode register 40. Each of the local mode registers 46 and 47 is a partial mode register that holds a mode parameter MR59<5,4,0>. The mode parameters MR59<5:4> and MR59<0> represent an ARFM and a DRFM, respectively. The mode parameter MR59<5,4,0> held in each of the local mode registers 46 and 47 is respectively supplied to the memory cell array areas 11 and 12 through the data junction circuits 51 and 52. A unit register that holds a mode parameter MR59<7:0> is included in the main mode register 40. As shown in FIG. 3, the mode parameter MR59<7:0> is a mode parameter related to Refresh. The mode parameter MR59<7:0> held in the main mode register 40 is supplied to the refresh control circuit 57.

Figure 10:
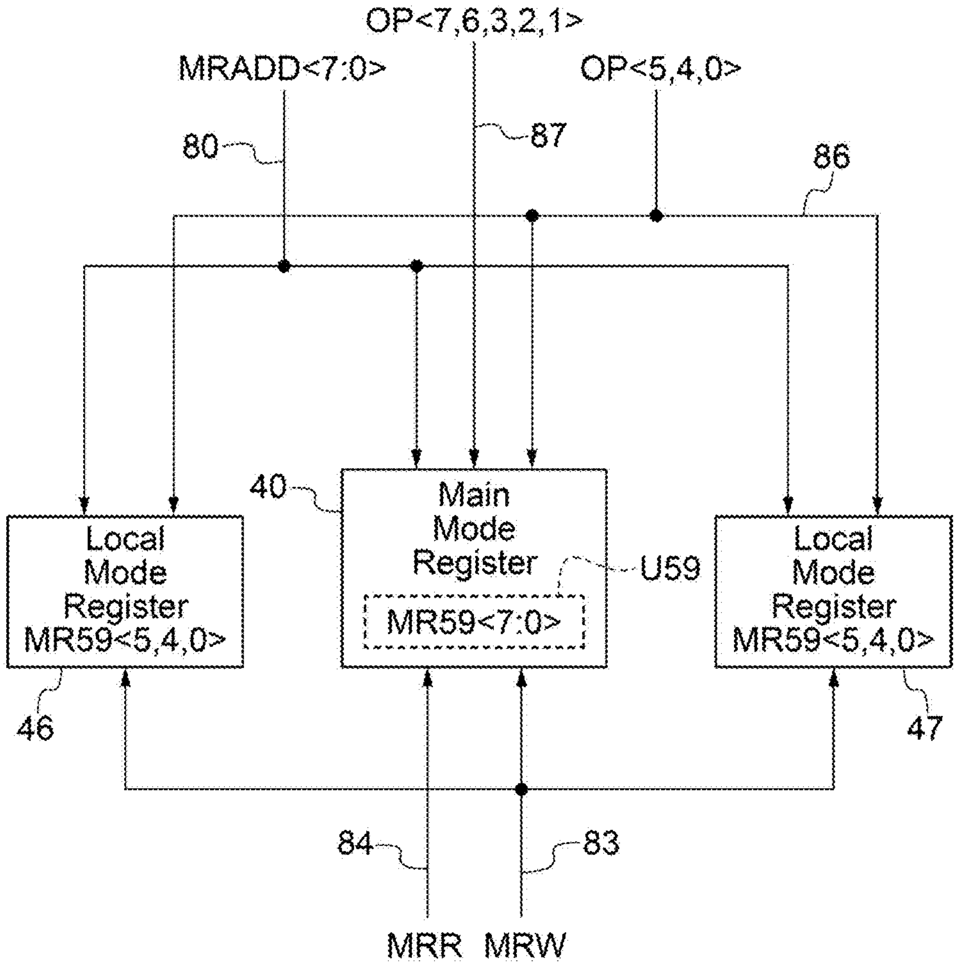

FIG. 10 is a circuit diagram for explaining lines that supply various signals output from the command decoder 56 shown in FIG. 5 to the main mode register 40 and the local mode registers 46 and 47. As shown in FIG. 10, while the mode address MRADD<7:0>, the operand OP<5,4,0>, and the mode register write signal MRW are supplied to the local mode registers 46 and 47 via the lines 80 and 83 and a line 86, the line 84 and a line 87 are not connected to the local mode registers 46 and 47, and thus an operand OP<7,6,3, 2,1> and the mode register read signal MRR are not supplied to the local mode registers 46 and 47. The line 86 is a line that transfers the operand OP<5,4,0> and the line 87 is a line that transfers the operand OP<7,6,3,2,1>. With this configuration, when overwriting of the mode parameter MR59<7:0> is commanded by a mode register write command from outside, the command decoder 56 activates the mode register write signal MRW and outputs the mode address MRADD<7:0> and the operand OP<7:0>. Accordingly, the mode parameter MR59<7:0> is overwritten in a unit register U59 included in the main mode register 40 and the mode parameter MR59<5,4,0> is overwritten in the local mode registers 46 and 47. In this manner, the mode parameter MR59<7:0> is held not only in the main mode register 40 but a part thereof is also held in the local mode registers 46 and 47. Meanwhile, when reading of the mode parameter MR59<7:0> is commanded by a mode register read command from outside, the mode parameter MR59<7:0> is read out from the unit register U59 included in the main mode register 40.

In this manner, any local mode register is not required to be allocated to circuits provided in the vicinity of the main mode register 40 such as the refresh control circuit 57, and it is permissible to supply a mode parameter directly from the main mode register 40 to these circuits.

Figure 11A:
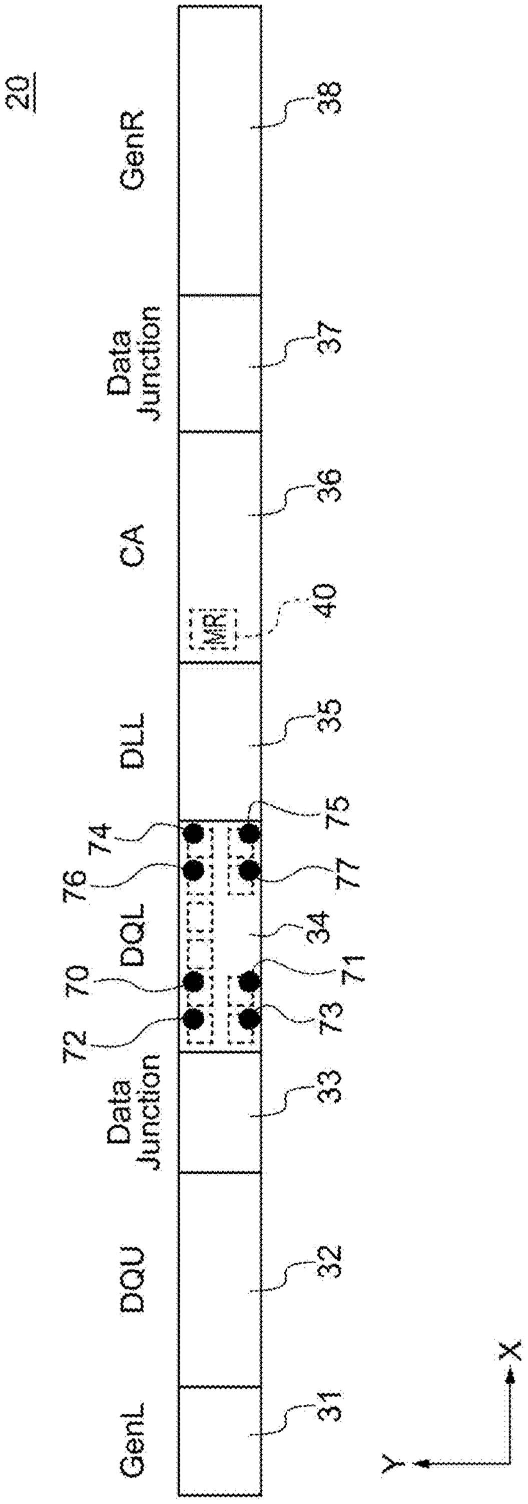
Figure 11B:
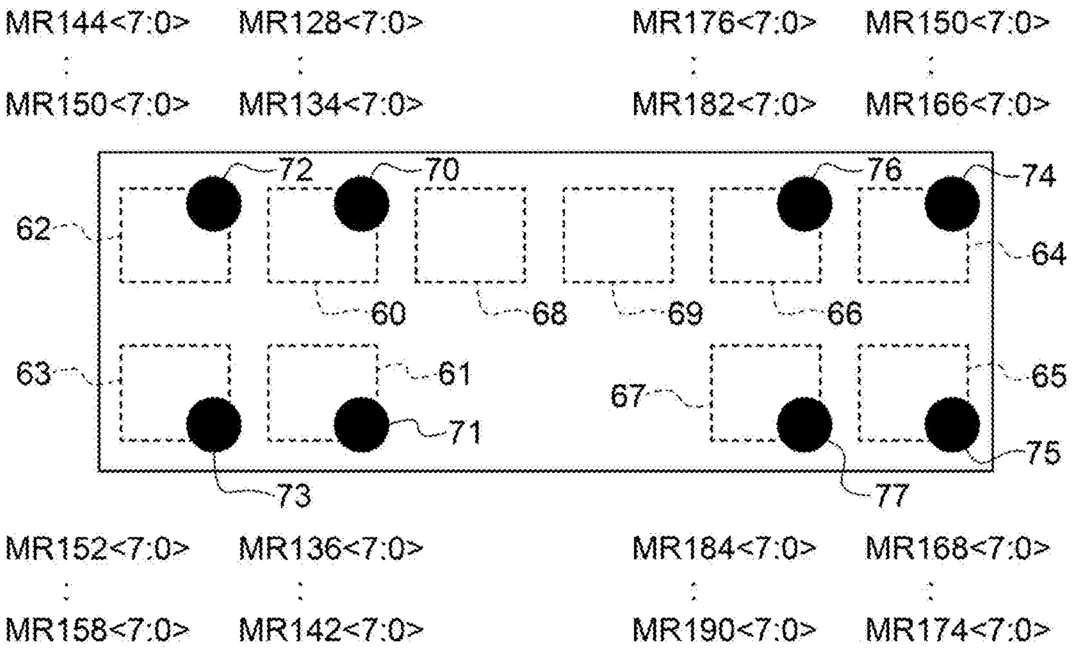

FIGS. 11A and 11B are schematic diagrams respectively showing a layout of the main mode register 40 and local mode registers 70 to 77. FIG. 11A shows the entirety of the center area 20 and FIG. 11B shows the data input-output circuit area 34 in an enlarged manner. Data control circuits 60 to 67 that respectively control input and output of data DQ0 to DQ7 and data-strobe control circuits 68 and 69 that respectively control input and output of data strobe signals DQS and DQSF are provided in the data input-output circuit area 34. The local mode registers 70 to 77 are respectively provided to be adjacent to the data control circuits 60 to 67. The local mode register 70 holds the mode parameters MR128<7:0> to MR134<7:0>. The local mode register 71 holds the mode parameters MR136<7:0> to MR142<7:0>. The local mode register 72 holds mode parameters MR144<7:0> to MR150<7:0>. The local mode register 73 holds mode parameters MR152<7:0> to MR158<7:0>. The local mode register 74 holds mode parameters MR150<7:0> to MR166<7:0>. The local mode register 75 holds mode parameters MR168<7:0> to MR174<7:0>. The local mode register 76 holds mode parameters MR176<7:0> to MR182<7:0>. The local mode register 77 holds mode parameters MR184<7:0> to MR190<7:0>.

The mode parameters MR128<7:0> to MR134<7:0> used for the data DQ0 held in the local mode register 70 are supplied to the data control circuit 60 associated to the data DQ0. The mode parameters MR136<7:0> to MR142<7:0> used for the data DQ1 held in the local mode register 71 are supplied to the data control circuit 61 associated to the data DQ1. The mode parameters MR144<7:0> to MR150<7:0> used for the data DQ2 held in the local mode register 72 are supplied to the data control circuit 62 associated to the data DQ2. The mode parameters MR152<7:0> to MR158<7:0> used for the data DQ3 held in the local mode register 73 are supplied to the data control circuit 63 associated to the data DQ3. The mode parameters MR150<7:0> to MR166<7:0> used for the data DQ4 held in the local mode register 74 are supplied to the data control circuit 64 associated to the data DQ4. The mode parameters MR168<7:0> to MR174<7:0> used for the data DQ5 held in the local mode register 75 are supplied to the data control circuit 65 associated to the data DQ5. The mode parameters MR176<7:0> to MR182<7:0> used for the data DQ6 held in the local mode register 76 are supplied to the data control circuit 66 associated to the data DQ6. The mode parameters MR184<7:0> to MR190<7:0> used for the data DQ7 held in the local mode register 77 are supplied to the data control circuit 67 associated to the data DQ7.

The main mode register 40 does not include any unit register that holds the mode parameters MR128<7:0> to MR134<7:0> associated to the data DQ0. The main mode register 40 also does not include any mode parameter associated to the data DQ1 to DQ7.

Figure 12:
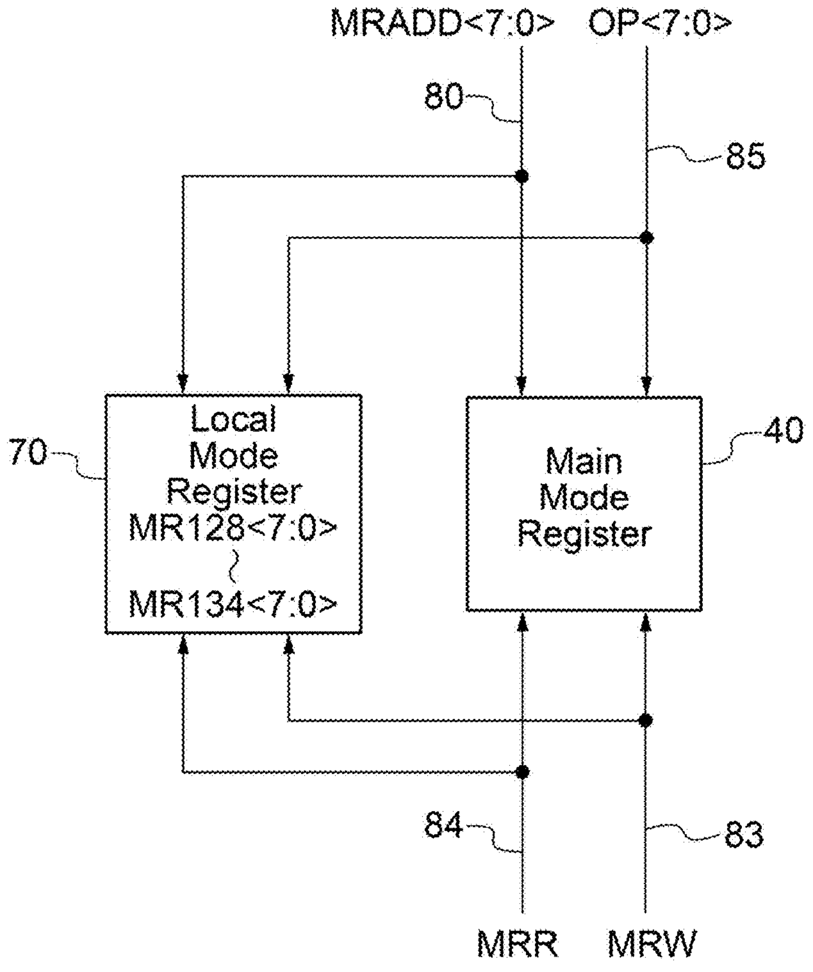

FIG. 12 is a circuit diagram for explaining lines that supply various signals output from the command decoder 56 shown in FIG. 5 to the main mode register 40 and the local mode register 70. As shown in FIG. 12, the mode address MRADD<7:0>, the operand OP<7:0>, the mode register write signal MRW, and the mode register read signal MRR are supplied to the local mode register 70 via the lines 80, 85, 83, and 84. With this configuration, when overwriting of the mode parameter MR128<7:0> is commanded by a mode register write command from outside, the command decoder 56 activates the mode register write signal MRW and outputs the mode address MRADD<7:0> and the operand OP<7:0>. Accordingly, the mode parameter MR128<7:0> is overwritten in the local mode register 70. Since the main mode register 40 does not include any unit register that holds the mode parameter MR128<7:0>, the mode parameter MR128<7:0> is not written in the main mode register 40. Further, when reading of the mode parameter MR128<7:0> is commanded by a mode register read command from outside, the mode parameter MR128<7:0> is read out from the local mode register 70.

In this manner, a part of mode parameters is held only in local mode registers and not held in the main mode register 40. Accordingly, the circuit size of the main mode register 40 can be reduced.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:

a command decoder configured to supply a plurality of mode parameters including a first mode parameter;

a main mode register including a plurality of unit registers each configured to store an associated one of the plurality of mode parameters;

a first local mode register configured to store at least a part of the first mode parameter; and a first circuit configured to be controlled by at least the part of the first mode parameter supplied from the first local mode register, wherein a distance between the first local mode register and the first circuit is shorter than a distance between the main mode register and the first circuit, and wherein the first mode parameter supplied from the command decoder is stored in each of the main mode register and the first local mode register responsive to a mode register write signal.

2. The apparatus of claim 1, wherein the first mode parameter is, responsive to a mode register read signal, read out from the main mode register without read out from the first local mode register.

3. The apparatus of claim 2, wherein the plurality of mode parameters further include a second mode parameter, wherein the apparatus further comprises:

a second local mode register configured to store the second mode parameter; and a second circuit configured to be controlled by the second mode parameter supplied from the second local mode register, wherein a distance between the second local mode register and the second circuit is shorter than a distance between the main mode register and the second circuit, and wherein the second mode parameter supplied from the command decoder is stored in the second local mode register responsive to the mode register write signal without stored in the main mode register.

4. The apparatus of claim 3, wherein the second mode parameter is read out from the second local mode register responsive to the mode register read signal.

5. The apparatus of claim 1, wherein the plurality of mode parameters further include a third mode parameter, wherein the apparatus further comprises:

a first partial mode register configured to store a part of the third mode parameter;

a second partial mode register configured to store another part of the third mode parameter;

a third circuit configured to be controlled by the part of the third mode parameter supplied from the first partial mode register; and a fourth circuit configured to be controlled by the another part of the third mode parameter supplied from the second partial mode register, and wherein the part of the third parameter and the another part of the third parameter supplied from the command decoder are stored in the first partial mode register and the second partial mode register, respectively, responsive to the mode register write signal.

6. The apparatus of claim 5, wherein the third parameter supplied from the command decoder is stored in the main mode register responsive to the mode register write signal.

7. The apparatus of claim 6, wherein a distance between the first partial mode register and the third circuit is shorter than a distance between the main mode register and the third circuit, and wherein a distance between the second partial mode register and the fourth circuit is shorter than a distance between the main mode register and the fourth circuit.

8. The apparatus of claim 7, further comprising:

a third local mode register configured to store the third mode parameter; and a fifth circuit configured to be controlled by the third mode parameter supplied from the third local mode register, wherein a distance between the third local mode register and the fifth circuit is shorter than a distance between the main mode register and the fifth circuit.

9. The apparatus of claim 1, wherein the plurality of mode parameters further include a fourth mode parameter, and wherein the apparatus further comprises:

a third partial mode register configured to store a part of the fourth mode parameter;

a sixth circuit configured to be controlled by the part of the fourth mode parameter supplied from the third partial mode register; and a seventh circuit configured to be controlled by the fourth mode parameter supplied from the main mode register.

10. The apparatus of claim 9, wherein the fourth parameter and the part of the fourth parameter supplied from the command decoder are stored in the main mode register and the third partial mode register, respectively, responsive to the mode register write signal.

11. The apparatus of claim 1, further comprising:

a plurality of first signal lines that connect the command decoder to the main mode register and the first local mode register; and a plurality of second signal lines that connect the first local mode register to the first circuit, wherein a part of the plurality of first signal lines are provided on an upper level wiring layer, wherein another part of the plurality of first signal lines are provided on a lower level wiring layer, and wherein the plurality of second signal lines are provided on the lower level wiring layer without provided on the upper level wiring layer.

12. An apparatus comprising:

a command decoder configured to supply a plurality of mode parameters including a first mode parameter and a second mode parameter;

a main mode register including a plurality of unit registers each configured to store an associated one of the plurality of mode parameters excluding the second mode parameter;

a local mode register configured to store the second mode parameter;

a first circuit configured to be controlled by at least the part of the first mode parameter supplied from the main mode register; and a second circuit configured to be controlled by the second mode parameter supplied from the local mode register, wherein a distance between the local mode register and the second circuit is shorter than a distance between the main mode register and the second circuit.

13. The apparatus of claim 12, wherein each of the first and second mode parameters is supplied from the command decoder to both the main mode register and the local mode register responsive to a mode register write signal.

14. The apparatus of claim 13, wherein the first mode parameter supplied from the command decoder is stored in the main mode register without stored in the local mode register.

15. The apparatus of claim 14, wherein the first mode parameter is read out from the main mode register responsive to a mode register read signal, and wherein the second mode parameter is read out from the local mode register responsive to the mode register read signal.

16. An apparatus comprising:

a command decoder configured to supply a plurality of mode parameters including a first mode parameter;

a plurality of first signal lines coupled to the command decoder to convey the plurality of mode parameters;

a main mode register including a plurality of unit registers each configured to store an associated one of the plurality of mode parameters, the main mode register being coupled to the command decoder via the plurality of first signal lines;

a first partial mode register configured to store a part of the first mode parameter, the first partial mode register being coupled to the command decoder via a part of the plurality of first signal lines; and a first circuit configured to be controlled by the part of the first mode parameter supplied from the first partial mode register, wherein a distance between the first partial mode register and the first circuit is shorter than a distance between the main mode register and the first circuit.

17. The apparatus of claim 16, further comprising:

a second partial mode register configured to store another part of the first mode parameter, the second partial mode register being coupled to the command decoder via another part of the plurality of first signal lines; and a second circuit configured to be controlled by the another part of the first mode parameter supplied from the second partial mode register, wherein a distance between the second partial mode register and the second circuit is shorter than a distance between the main mode register and the second circuit.

18. The apparatus of claim 17, further comprising:

a local mode register configured to store the first mode parameter, the local mode register being coupled to the command decoder via the plurality of first signal lines; and a third circuit configured to be controlled by the first mode parameter supplied from the local mode register, wherein a distance between the local mode register and the third circuit is shorter than a distance between the main mode register and the third circuit.

19. The apparatus of claim 16, further comprising a fourth circuit configured to be controlled by the first mode parameter supplied from the main mode register.

20. The apparatus of claim 16, wherein, responsive to a mode register write signal, the first mode parameter on the plurality of signal lines and the part of the first mode parameter on the part of the plurality of signal lines are simultaneously stored in the main mode register and the first partial mode register, respectively.

* * * * *